United States Patent
Aull et al.

(10) Patent No.: US 11,372,119 B2
(45) Date of Patent: Jun. 28, 2022

(54) RAPID PROTOTYPING OF SINGLE-PHOTON-SENSITIVE SILICON AVALANCHE PHOTODIODES

(71) Applicant: Massachusetts Institute of Technology, Cambridge, MA (US)

(72) Inventors: Brian F. Aull, Cambridge, MA (US); Joseph S. Ciampi, Westford, MA (US); Renee D. Lambert, Framingham, MA (US); Christopher Leitz, Watertown, MA (US); Karl Alexander McIntosh, Groton, MA (US); Steven Rabe, W. Roxbury, MA (US); Kevin Ryu, Arlington, MA (US); Daniel R. Schuette, Arlington, MA (US); David Volfson, Sharon, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 336 days.

(21) Appl. No.: 16/778,042

(22) Filed: Jan. 31, 2020

(65) Prior Publication Data
US 2020/0319355 A1 Oct. 8, 2020

Related U.S. Application Data

(60) Provisional application No. 62/828,216, filed on Apr. 2, 2019.

(51) Int. Cl.
*H01L 27/146* (2006.01)
*G01T 1/24* (2006.01)

(52) U.S. Cl.
CPC .......... *G01T 1/248* (2013.01); *H01L 27/1464* (2013.01); *H01L 27/14609* (2013.01); *H01L 27/14634* (2013.01); *H01L 27/14643* (2013.01)

(58) Field of Classification Search
CPC .............. G01T 1/248; H01L 27/14609; H01L 27/14634; H01L 27/1464; H01L 27/14643; H01L 27/14687; H01L 27/1469
See application file for complete search history.

(56) References Cited

U.S. PATENT DOCUMENTS

2005/0205930 A1 9/2005 Williams
2009/0200585 A1 8/2009 Nozaki et al.
(Continued)

OTHER PUBLICATIONS

Aull, "3D imaging with Geiger-mode avalanche photodiodes." Optics and Photonics News 16.5 (2005): 42-46.
(Continued)

*Primary Examiner* — Tucker J Wright
(74) *Attorney, Agent, or Firm* — Smith Baluch LLP

(57) ABSTRACT

A chip-to-chip integration process for rapid prototyping of silicon avalanche photodiode (APD) arrays has been developed. This process has several advantages over wafer-level 3D integration, including: (1) reduced cost per development cycle since a dedicated full-wafer read-out integrated circuit (ROIC) fabrication is not needed, (2) compatibility with ROICs made in previous fabrication runs, and (3) accelerated schedule. The process provides several advantages over previous processes for chip-to-chip integration, including: (1) shorter processing time as the chips can be diced, bump-bonded, and then thinned at the chip-level faster than in a wafer-level back-illumination process, and (2) the CMOS substrate provides mechanical support for the APD device, allowing integration of fast microlenses directly on the APD back surface. This approach yields APDs with low dark count rates (DCRs) and higher radiation tolerance for harsh environments and can be extended to large arrays of APDs.

18 Claims, 12 Drawing Sheets

(56) References Cited

U.S. PATENT DOCUMENTS

| | | | |
|---|---|---|---|
| 2009/0256227 A1 | 10/2009 | Bhaskaran et al. | |
| 2012/0012957 A1* | 1/2012 | Larsen | G01T 3/08 |
| | | | 257/E31.086 |
| 2012/0190150 A1 | 7/2012 | Levine et al. | |
| 2013/0009265 A1 | 1/2013 | Dautet et al. | |

OTHER PUBLICATIONS

Clifton et al., "Medium altitude airborne Geiger-mode mapping LIDAR system." Laser Radar Technology and Applications XX; and Atmospheric Propagation XII. vol. 9465. International Society for Optics and Photonics, 2015. 9 pages.

Enquist et al. "Low cost of ownership scalable copper direct bond interconnect 3D IC technology for three dimensional integrated circuit applications." 2009 IEEE International Conference on 3D System Integration. IEEE, 2009. 6 pages.

Frechette et al., "Readout circuitry for continuous high-rate photon detection with arrays of InP Geiger-mode avalanche photodiodes." Advanced Photon Counting Techniques VI. vol. 8375. International Society for Optics and Photonics, 2012. 10 pages.

Grein et al., "Efficient communication at telecom wavelengths using wavelength conversion and silicon photoncounting detectors." Free-Space Laser Communications VII. vol. 6709. International Society for Optics and Photonics, 2007. 6 pages.

Ibbotson et al., "Plasmaless dry etching of silicon with fluorine-containing compounds." Journal of applied physics 56.10 (1984): 2939-2942.

International Search Report and Written Opinion in International Patent Application No. PCT/US2020/016035 dated Apr. 28, 2020, 12 pages.

Schuette et al., "Hybridization process for back-illuminated silicon Geiger-mode avalanche photodiode arrays." Advanced Photon Counting Techniques IV. vol. 7681. International Society for Optics and Photonics, 2010. 8 pages.

Schuette et al., "MBE back-illuminated silicon Geiger-mode avalanche photodiodes for enhanced ultraviolet response." Advanced Photon Counting Techniques V. vol. 8033. International Society for Optics and Photonics, 2011. 10 pages.

\* cited by examiner

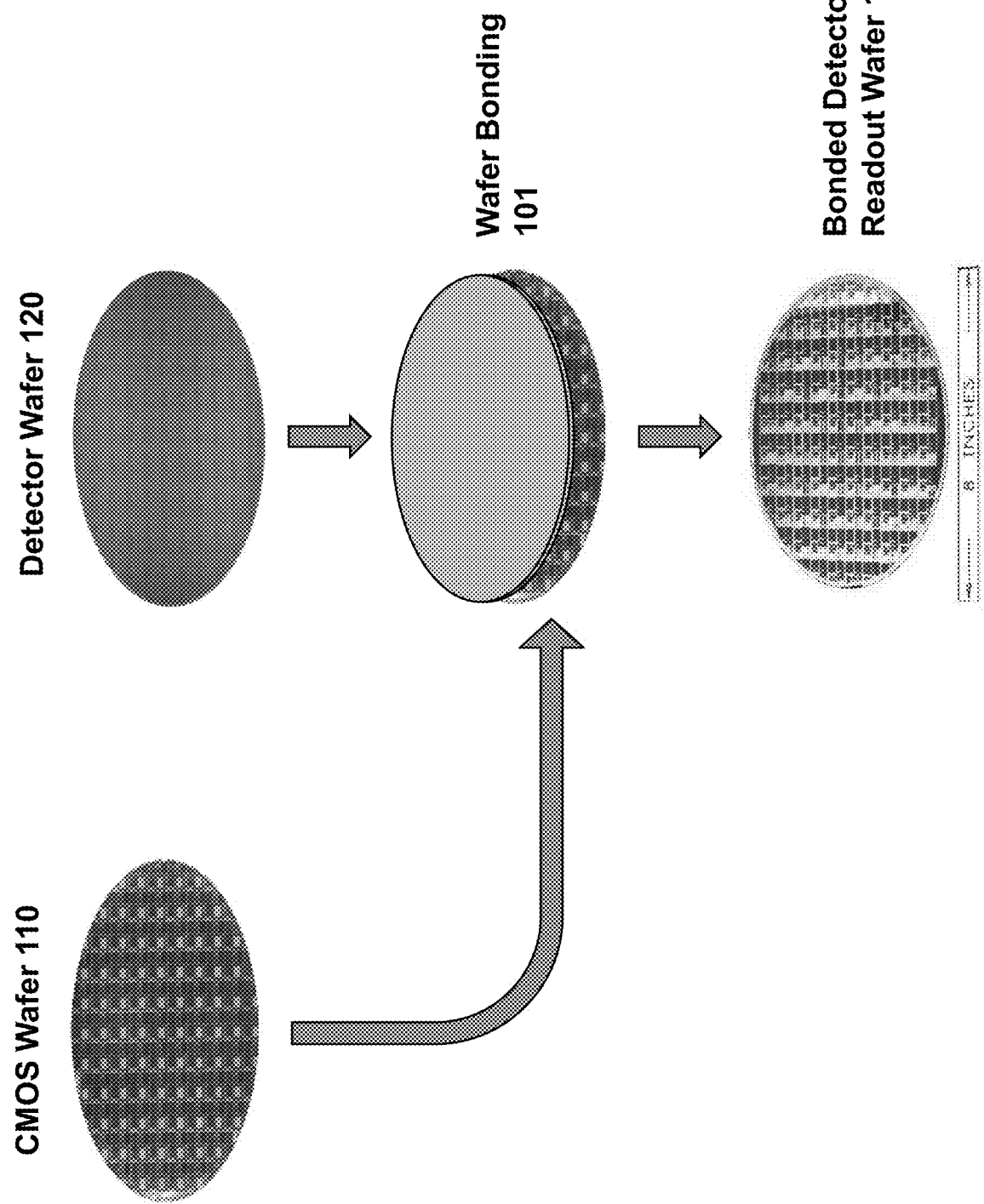

RAPID PROTOTYPING OF SINGLE-PHOTON-SENSITIVE SILICON AVALANCHE PHOTODIODES

CROSS REFERENCE TO RELATED APPLICATION(S)

This application claims the priority benefit, under 35 U.S.C. 119(e), of U.S. Application No. 62/828,216, which was filed on Apr. 2, 2019, and is incorporated herein by reference in its entirety.

GOVERNMENT SUPPORT

This invention was made with Government support under Grant No. FA8702-15-D-0001 awarded by the U.S. Air Force. The Government has certain rights in the invention.

BACKGROUND

Geiger-mode avalanche photodiodes (GmAPDs) can detect single photons and time stamp their arrivals with sub-nanosecond precision. Such arrays are useful in lidar applications as well as high-speed optical communication. Silicon APDs have low defect densities, leading to low dark count rates with minimal cooling. Silicon also offers superior material uniformity leading to high-yielding low-cost detector arrays. Silicon provides exceptional detection performance in the visible and NIR wavebands (400-900 nm).

Typically, silicon APD arrays are fabricated on one wafer and integrated onto respective readout integrated circuits (ROICs) fabricated on a separate complementary metal-oxide-silicon (CMOS) wafer. This provides freedom to optimize the detector and CMOS fabrication processes separately. It also provides the freedom to mate different detector designs to existing ROICs for detection optimization in different wavebands or, conversely, to mate existing detectors to different ROICs for different functionality.

FIG. 1A illustrates wafer-to-wafer process for integrating APDs with ROICs to make a silicon GmAPD array chip. The ROICs are fabricated in a CMOS wafer 110 by a CMOS foundry run that can cost $250,000 to $10,000,000. In the meantime, the APDs are fabricated in a detector wafer 120, in a process that takes up to 24 months. The detector wafer 120 is bonded to the CMOS detector wafer 110 in a wafer bonding step 101 that yields a bonded detector/CMOS readout wafer 130 that can be diced into individual APD/ROIC chips. Although this process creates great defect-free single-photon imager, it is too expensive and time-consuming to use for fabricating a handful of parts.

Three-dimensional (3D) APD/ROIC integration processes resulting in high pixel yield and spatial uniformity have been demonstrated using the Ziptronix Direct Bond Interconnect® (DBI) process. After 3D integration, these APD arrays need to be backside-illuminated, requiring uniform thinning to a target thickness that is a small fraction of the initial APD wafer thickness. These 3D integration and backside illumination processes are usually done on the wafer scale, requiring a costly dedicated full-wafer CMOS foundry run and careful co-design of the APD device layout and reticle stepping plan. For an advanced CMOS technology node, ROIC fabrication alone can cost millions of dollars.

Chip-to-chip integration, therefore, is favorable for prototyping hybridized APD arrays. For silicon, however, the APD substrate is opaque and needs to be removed for the APDs to detect light. This leads to challenges as the active device (APD) layer is typically less than 10 μm in thickness for APDs designed for visible wavelengths. Uniformly removing the bulk of the silicon substrate and leaving a uniform 10 μm thick silicon APD detector is challenging for either bulk grinding or chemical etching over a non-planar topology, such as that of an APD layer bump-bonded to a ROIC. In the past, a method for producing mechanically stable chips on quartz wafer has been used for bump-bondable silicon APDs. However, this complex process involves two wafer bonding steps and yields a low number of devices. Moreover, the imager is illuminated through a quartz support layer, limiting the speed (f-number) of microlenses that can be used to increase the detector fill factor.

FIG. 1B illustrates a bump-bonding process for making silicon APD chips. In the first step 151, a silicon handle wafer 150 is oxide bonded to a device wafer 152. In the second step 153, the device wafer 152 is thinned to yield a device layer 154 on the silicon handle wafer 150. The APDs are formed in the device layer 154 in step 155, then the device layer 154 is bonded to a quartz handle wafer 160 in step 157 for mechanical stability. The silicon handle wafer is removed in step 159, opening contacts in the device layer 154 for bump bonding to a CMOS ROIC 162 in step 161. This process yields high-quality devices but is time consuming because it involves both backside processing in step 155 and frontside processing in step 159. It also includes the addition of the quartz handle wafer 160 in step 157, which hinders integration of other components with the APD array. The quartz handle wafer 160 can be thinned mechanically, but too much thinning can compromise the APDs.

SUMMARY

This disclosure relates to an approach for rapid die-level assembly of fully depleted, backside-illuminated silicon imaging arrays to CMOS readout integrated circuits (ROICs). This approach comprises 1) fabrication of a custom silicon-on-insulator (SOI) wafer engineered with a built-in backside contact and passivation layer and 2) removal of the handle wafer after the silicon imaging array has been bump-bonded to the ROICs. The specialized SOI wafer facilitates uniform silicon imager substrate removal by selective etching at the die level after bump bonding. The integration process has several advantages over wafer-level 3D integration, including: 1) reduced cost per development cycle since a dedicated full-wafer ROIC fabrication is not needed, 2) compatibility with ROICs in chip-format from previous fabrication runs, and 3) accelerated schedule.

This approach can be applied to Geiger-mode APD (GmAPD) arrays, charge-coupled devices (CCDs), and active pixel sensors (CMOS imagers). These imager architectures have a depleted region of silicon in the bulk of the imager where the photodetection occurs. The back surface is passivated to establish this depleted region without excessive back surface dark current. Electrical performance of APD arrays made using the inventive technique(s) show 100% pixel connectivity and excellent yield before and after substrate removal. The approach is beneficial for development of new detector arrays for various sensitive light sensing applications.

This approach for fabricating an imaging device can be implemented as follows. A thermal oxide layer is deposited on a handle wafer. A backside passivation layer is formed on a device wafer. The backside passivation layer on the device wafer is bonded to the thermal oxide layer on the handle wafer to form an engineered substrate having the thermal oxide layer and the backside passivation layer between a handle layer and a device layer. An imaging array is formed in the device layer of the engineered substrate, then the engineered substrate is diced into an imaging array chip comprising the imaging array. A read-out integrated circuit is bonded to the imaging array chip, then at least a portion of the handle layer is removed from the imaging array chip.

The handle wafer can be a silicon handle wafer, the thermal oxide layer can comprise silicon dioxide, and the device wafer can be a silicon device wafer. The device layer can have a resistivity of at least 20 Ω-cm.

Depositing the thermal oxide layer on the handle wafer can include growing the thermal oxide layer to a thickness of about 20 nm to about 200 nm, e.g., so that the thermal oxide layer can be used as a visible-range anti-reflection coating in the completed device. The thermal oxide layer may be a first thermal oxide layer, in which case forming the backside passivation layer on the device wafer comprises depositing a second thermal oxide layer on the device wafer and implanting a $p^+$ dopant into the second thermal oxide layer to form the passivation layer.

Forming the imaging array in the device layer may include forming an avalanche photodiode, a charge-coupled device, and/or an active pixel sensor.

After bonding the backside passivation layer to the thermal oxide layer and before forming the imaging array, the backside passivation layer and the thermal oxide layer can be thermally annealed. After bonding the backside passivation layer to the thermal oxide layer and before dicing the engineered substrate into the imaging array chip, the device layer can be thinned to a thickness of about 10 µm.

Before bonding the read-out integrated circuit to the imaging array chip, the read-out integrated circuit and/or the imaging array chip can be tested, e.g., to ensure that they are fully functional and compatible before being bonded together.

Bonding the read-out integrated circuit to the imaging array chip can comprise forming at least one bump bond between the read-out integrated circuit and the imaging array chip. In this case, epoxy can be disposed between the imaging array chip and the read-out integrated circuit to secure the imaging array chip to the read-out integrated circuit.

Removing the handle layer portion may include chemically etching the handle layer to the thermal oxide layer. The handle layer can be mechanically thinned before being chemically etched to the thermal oxide layer. Optionally, a microlens array can be disposed directly on a surface of the imaging array chip opposite from the read-out integrated circuit.

The fabrication approach disclosed here can yield an imaging device comprising a read-out integrated circuit, an imaging array bump-bonded to the read-out integrated circuit, a passivation layer disposed on the imaging array, and a thermal oxide layer disposed on the passivation layer. The passivation layer can be thermally bonded to the thermal oxide layer. The imaging device may also include a microlens array, bonded directly to the thermal oxide layer, to direct incident light to the imaging array.

Fabricating an imaging device can also be implemented by depositing a first silicon dioxide layer having a thickness of about 60 nm to about 100 nm on a silicon handle wafer having a resistivity of at least about 20 Ω-cm (e.g., 160 Ω-cm) and by depositing a second silicon dioxide layer having a thickness of about 5 nm on a silicon device wafer having a resistivity of about 20 Ω-cm (e.g., 160 Ω-cm). $BF_2$ or another suitable dopant is implanted into the second silicon dioxide layer to transform the second silicon dioxide layer into a passivation layer. Then the first silicon dioxide layer is thermally bonded to the passivation layer to form an engineered substrate having the first silicon oxide layer and the passivation layer between a silicon handle layer formed of the silicon handle wafer and a silicon device layer formed of the silicon device wafer. The silicon device layer is thinned to a thickness of about 10 µm, then an avalanche photodiode (APD) array is formed in the silicon device layer. The engineered substrate is diced into an APD chip comprising the APD array. This APD chip is bump-bonded to a read-out integrated circuit before the silicon handle layer is removed from the APD chip. If desired, the APD chip can be tested before being bump-bonded to the read-out integrated circuit. Optionally, a microlens array to the APD chip after removing the silicon handle layer from the APD chip.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A illustrates a wafer-to-wafer integration process for making avalanche photodiode (APD) arrays bonded to CMOS readout integrated circuits (ROICs).

Figure 3A:
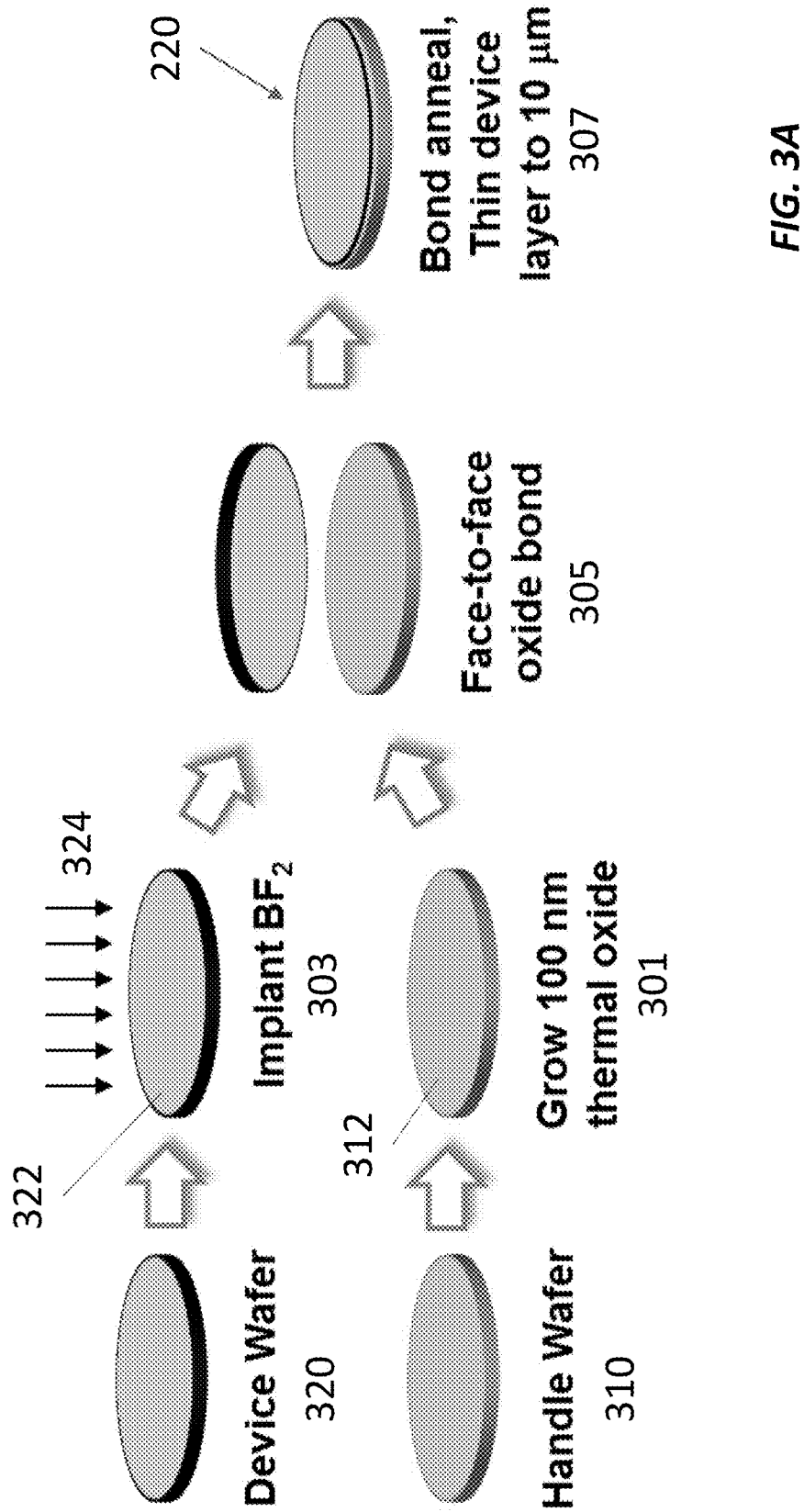

FIG. 3A illustrates a process for making an engineered substrate. The 200 mm diameter device wafer with appropriate resistivity is implanted with $BF_2$, after 5 nm thermal oxide is grown as the screening oxide. This implant layer is buried in the oxide-bonded interface and serves as the backside passivation of APDs, CCDs, or CMOS imagers. The handle wafer has 100 nm thermal oxide grown to serve as the etch stop layer. After these processes, the two wafers are bonded together, and the device layer is thinned to 10 µm via wet etching.

Figure 3C:
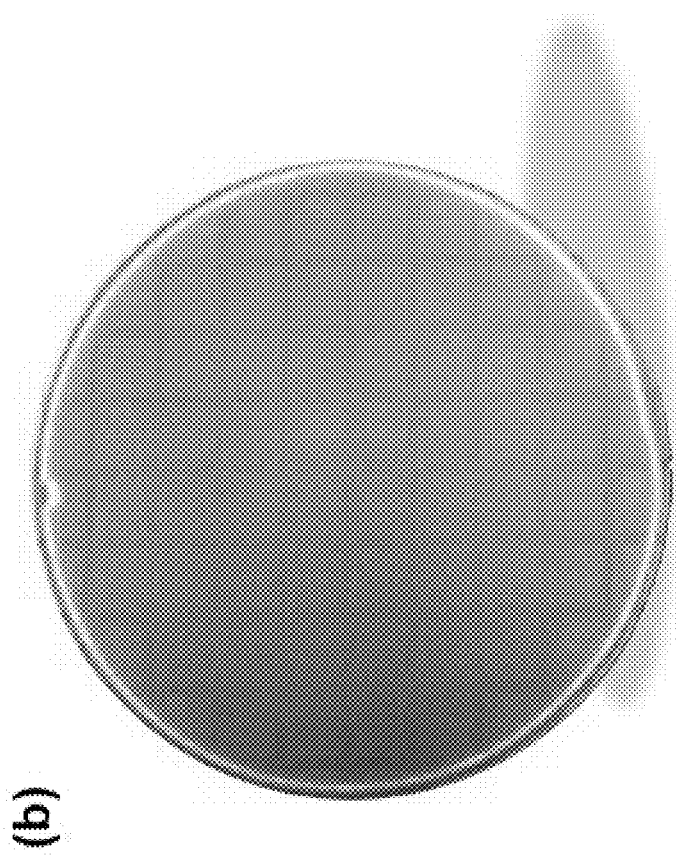
Figure 3B:
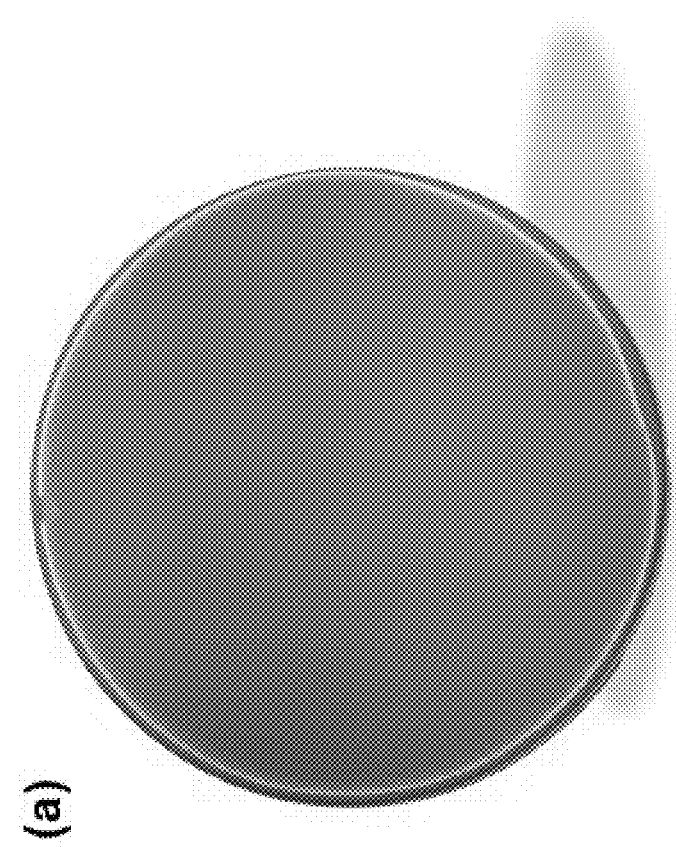

FIG. 3B shows a photograph of a finished engineered substrate. The engineered substrate is a specialized silicon-on-insulator (SOI) wafer which includes a 10 µm-thick 160 ohm-cm p-type silicon device layer with buried p+ implant for backside passivation on 100 nm thermal oxide bonding layer, which serves as the etch stop for the chip-level thinning process.

FIG. 3C is a photograph of a wafer with finished frontside-illuminated APDs on engineered substrates. The size of each reticle is about 20×22 mm. Devices are fabricated on 200-mm wafers.

Figure 4A:
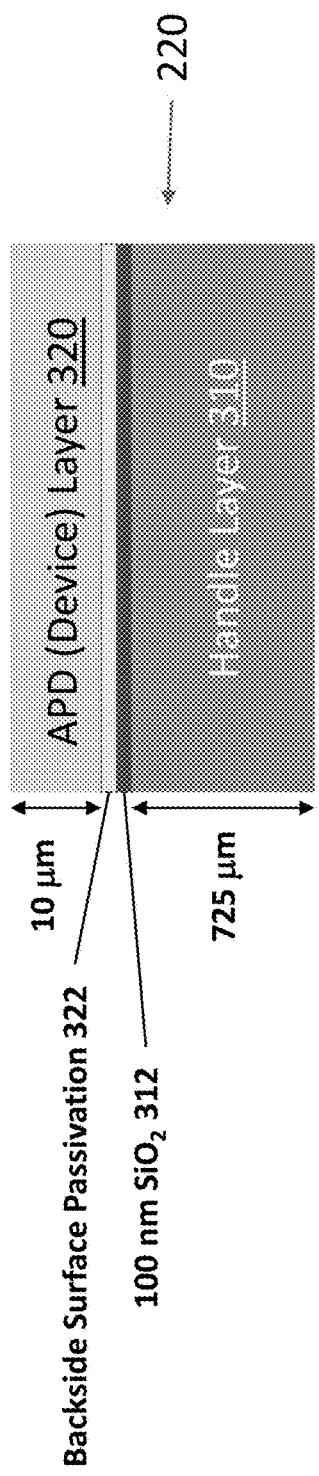

FIG. 4A shows a cross section of an engineered substrate.

Figure 4B:
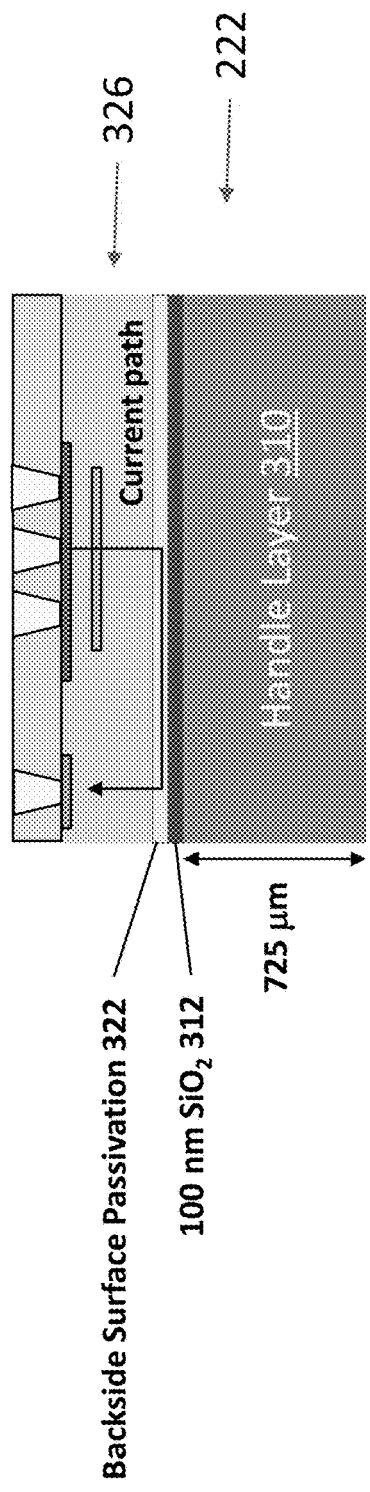

FIG. 4B shows a cross section of an APD array formed in the device layer of an engineered substrate.

Figures 5A, 5B:
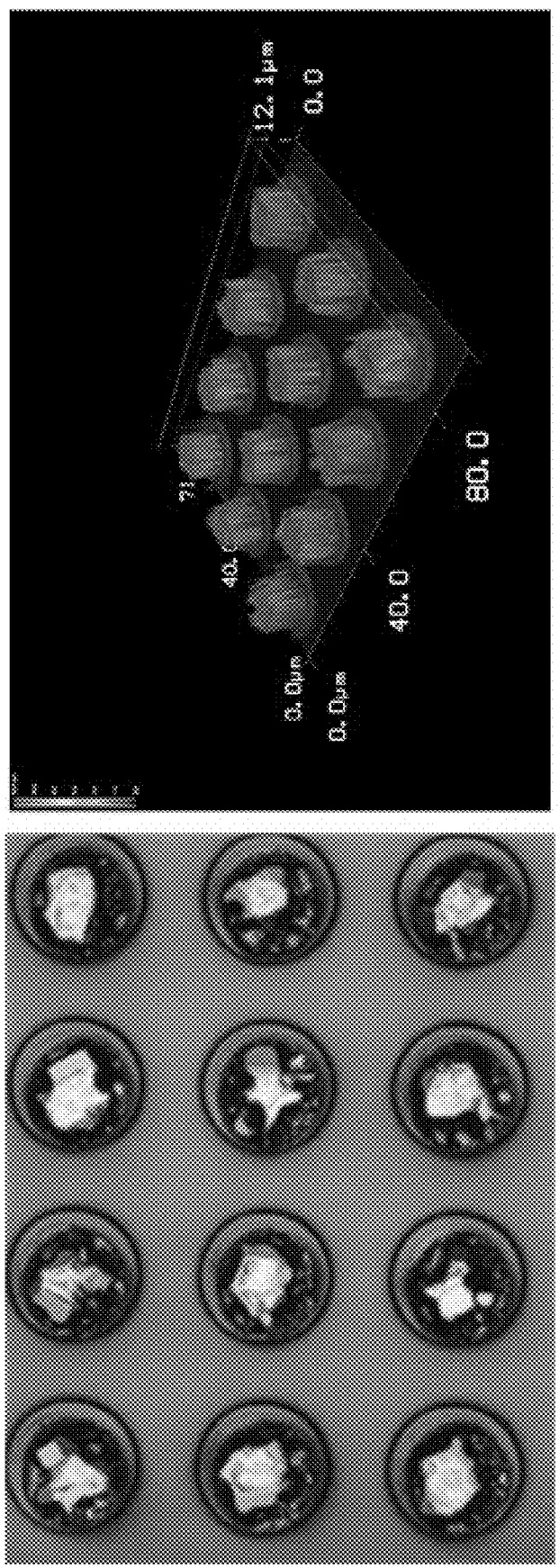

FIG. 5A shows an optical microscope image of 25 μm pitch indium bumps.

FIG. 5B shows a 3D laser scan of the indium bumps of FIG. 5A.

Figure 6A:
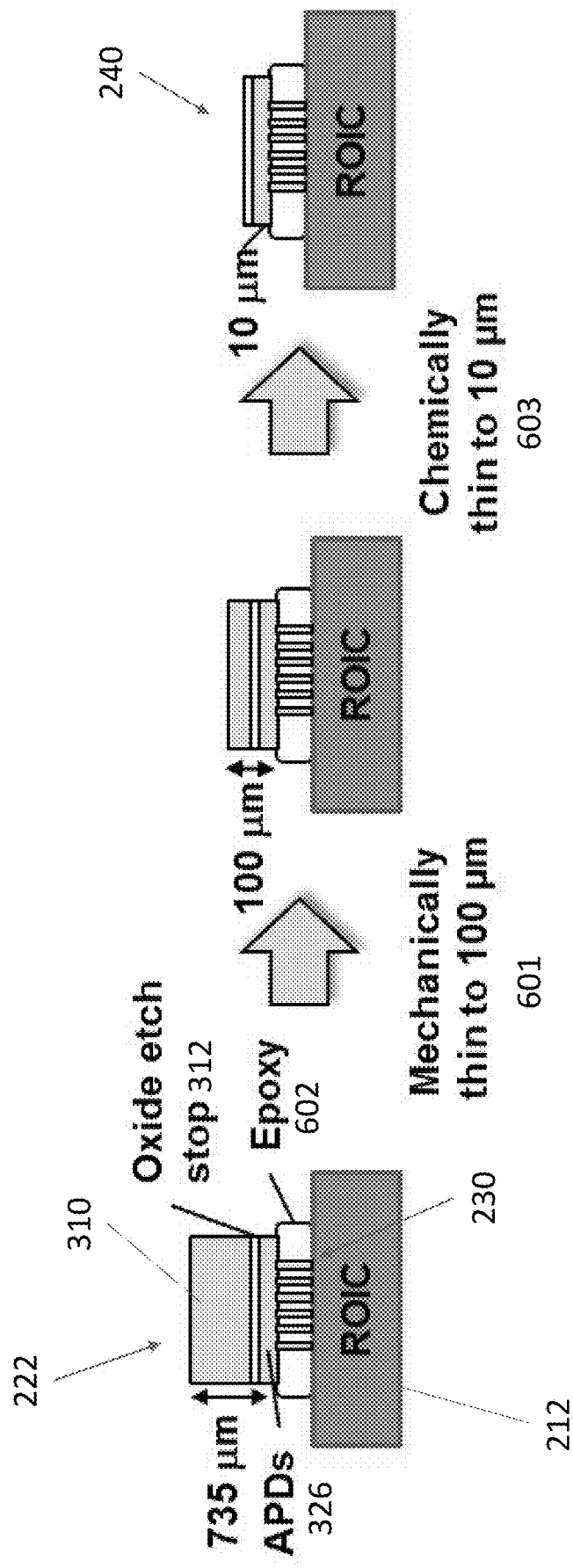

FIG. 6A illustrates a chip-level thinning process. First, the silicon APD layer is bump-bonded to a read-out integrated circuit (ROIC) and under-filled with epoxy. The epoxy provides mechanical support after the device layer is thinned down to 10 μm. The APDs built on an engineered substrate have an oxide etch stop layer 10 μm away from the bonding interface. Then the bulk of the carrier substrate is removed through a mechanical process using the dicing saw. Finally, the remaining carrier substrate is removed using the chemical etching process stopping on the buried etch stop layer. The chemical etch provides excellent selectivity to oxide.

Figure 6B:
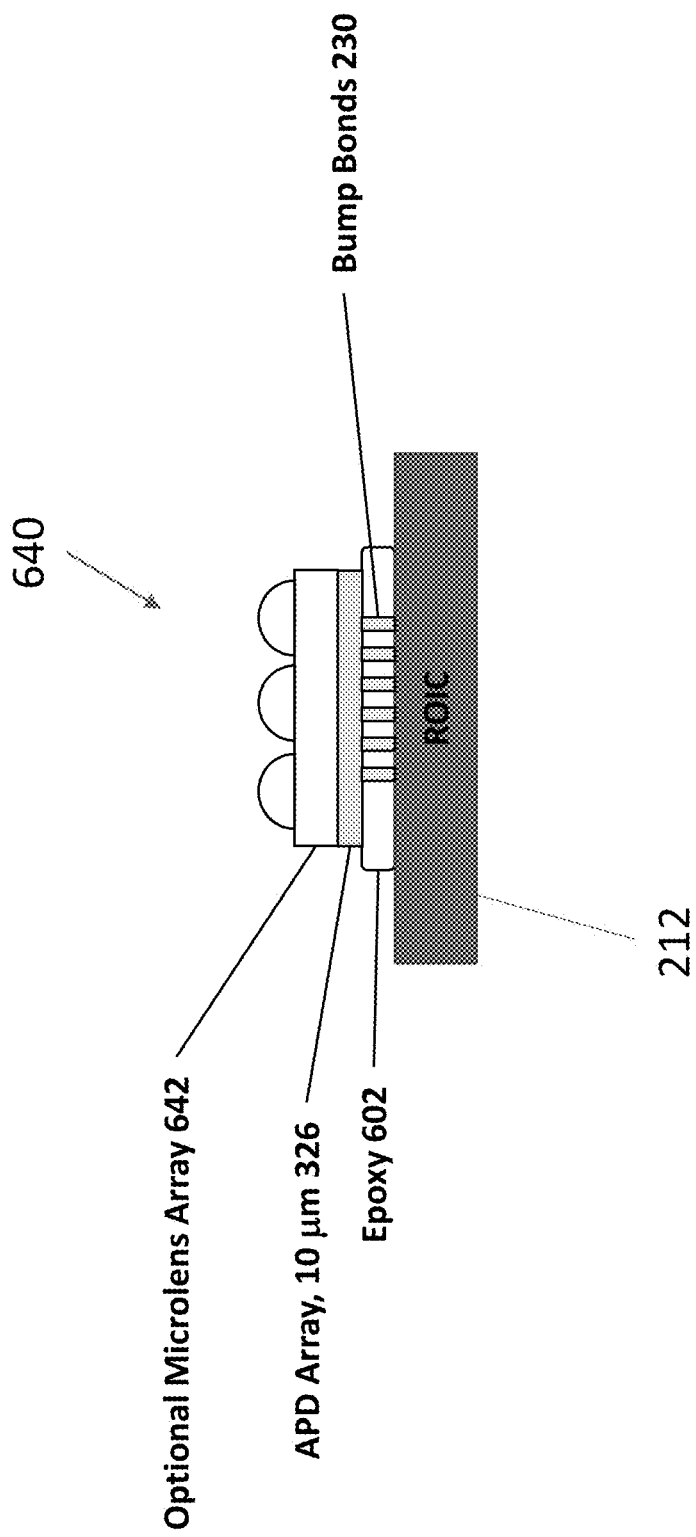

FIG. 6B shows a cross section of an APD chip bonded to a ROIC with a microlens array layer over the APD array.

Figure 7A:
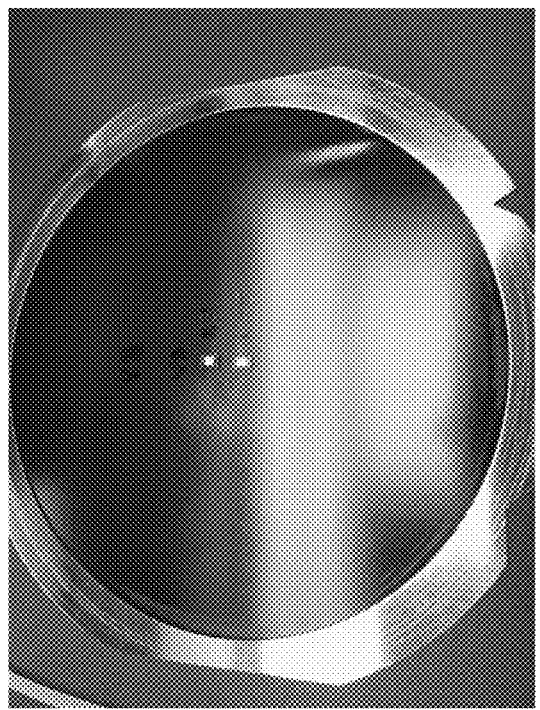

FIG. 7A shows two 32×32 hybridized APD/ROIC pairs are mounted on precision dicing tape in preparation for mechanical thinning down to 100 μm thick device layer.

Figure 7B:
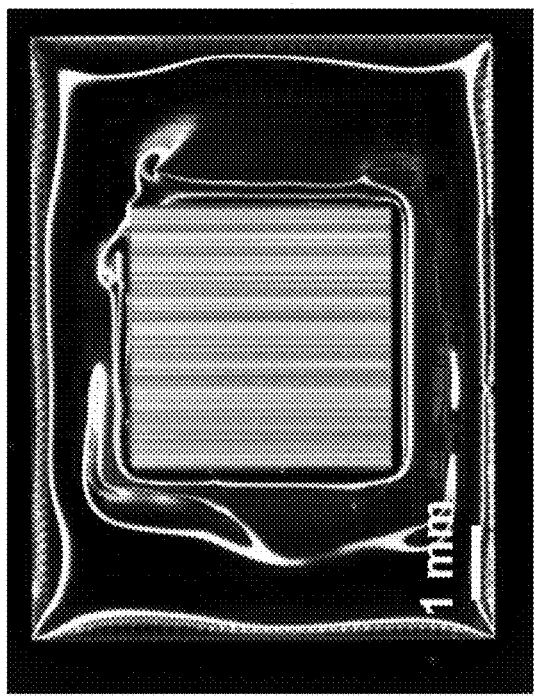

FIG. 7B shows a microscope image of a 32×32 APD ROIC after mechanical thinning. The vertical striations are due to dicing saw blade. The ROIC frame area is protected by polymer coating with blue dye added to aid visual inspection of the coating.

Figure 8A:
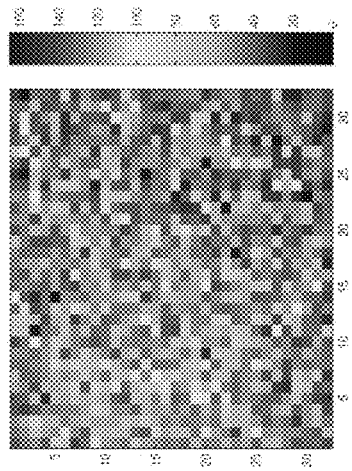
Figure 8B:
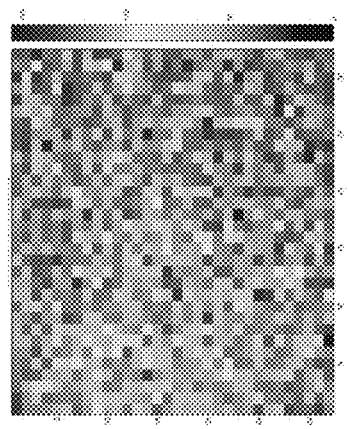

FIGS. 8A and 8B show spatial dark count rate (DCR) maps of the 32×32 APD array of FIG. 7B before mechanical thinning and after mechanical thinning, respectively. The DCR map is largely unchanged.

Figure 9:
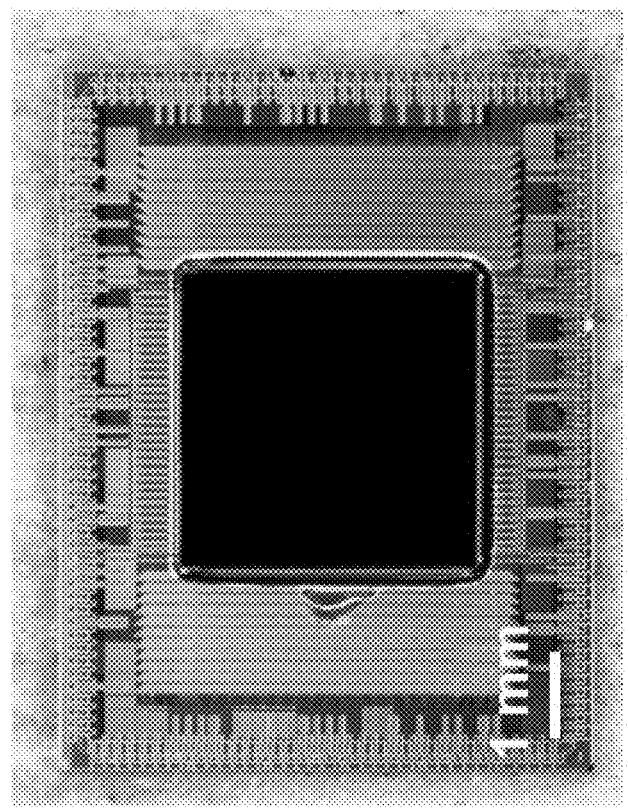

FIG. 9 is a die image of a finished 32×32 APD ROIC after chemical thinning to 10 μm thick device layer. The surface of the APD device layer is black as 100 nm-thick oxide etch stop film also serves as an anti-reflection coating.

Figure 10A:
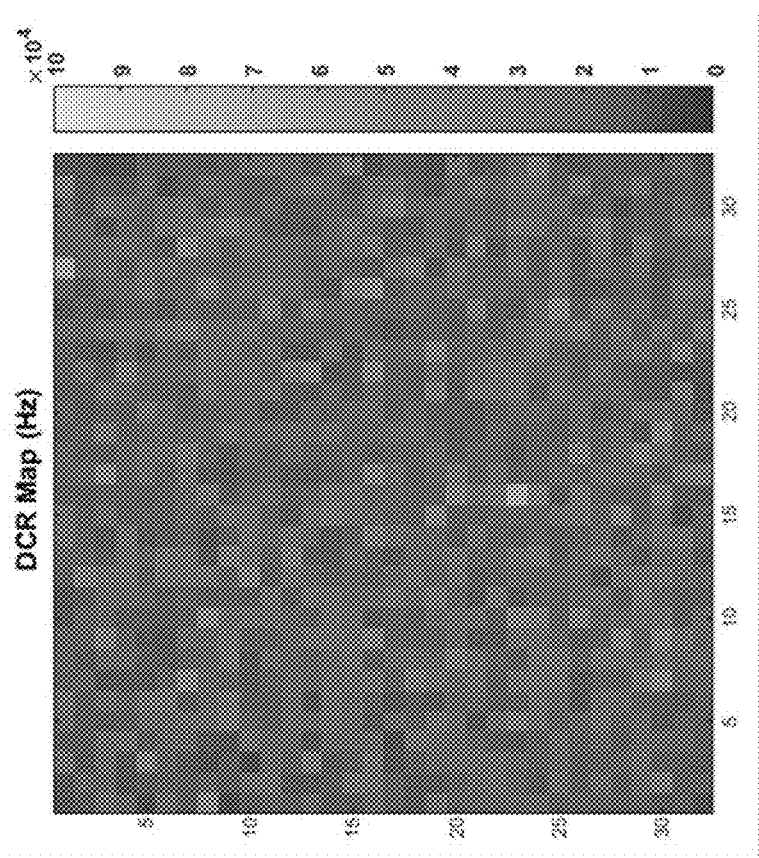
Figure 10B:
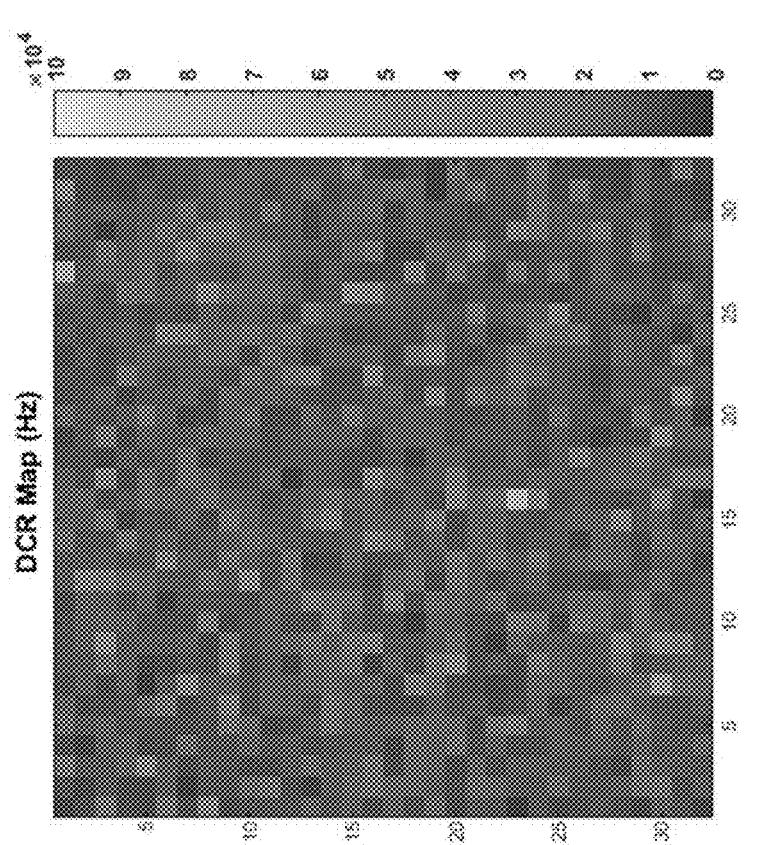

FIGS. 10A and 10B show spatial DCR maps of the 32×32 APD array of FIG. 9 before chemical thinning and after chemical thinning, respectively. The DCR is slightly higher after chemical thinning, possibly because of light leakage in the measurement setup.

Figure 11:
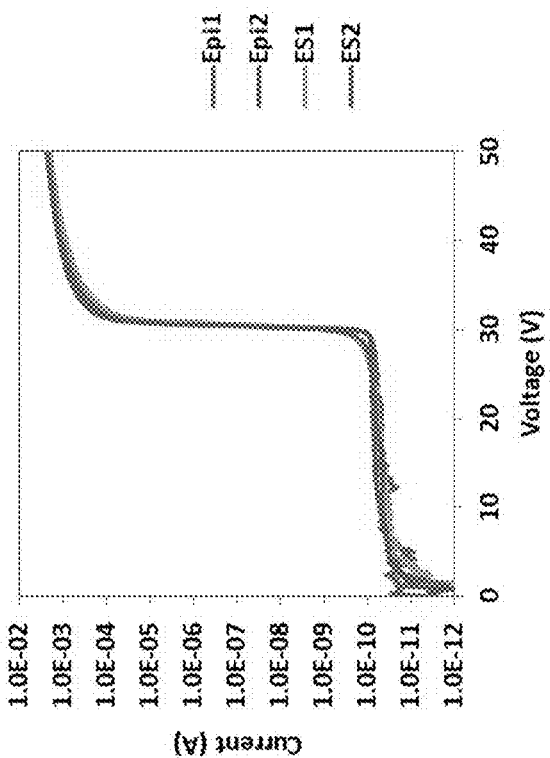

FIG. 11 is a plot of reverse bias I-V characteristics of silicon APDs fabricated on two engineered substrates (ES1, ES2) and two 20-μm thick, epitaxial 160-Ω-cm silicon on 0.02-Ω-cm p-type substrates (Epi1, Epi2).

DETAILED DESCRIPTION

Presently, silicon sensors are fabricated in a two- or three-stage process. Single-tier sensors like CCD or CMOS imagers are made in a two-stage process: (1) front-illumination, where device structures and metal interconnect networks are built on the front surface of the wafer, and (2) back-illumination, where the wafer is flipped over and the back surface is processed to optimize light collection. For hybrid sensors like GmAPD imagers (imagers composed of separate detector and ROIC tiers), an additional integration stage occurs between front- and back-illumination where the detector and ROIC tiers are mated. The process of front-illumination, hybridization, and back-illumination is quite long (e.g., 14-18 months).

Here, we introduce a much faster approach to making silicon imaging sensors. In our approach, a fully depleted silicon imager, such as an APD array, CCD, or active pixel array, is built on a specialized SOI wafer with a built-in backside passivation layer. The finished imaging array wafer is diced, bump-bonded to a ROIC chip, underfilled with epoxy, and the handle wafer is removed by selective etching at the die level. This approach has several benefits over other imaging array hybridization processes. First, the schedule to produce the final array is dramatically accelerated, as it does not include a time-consuming backside-illumination process after the frontside-illumination process. Second, the finished imaging arrays are electrically isolated from the handle wafer and any defects that might be introduced during the backside thinning, so the dark count rate (DCR) and current-voltage (I-V) characteristics measured just after the imaging array front-illumination fabrication are similar to those measured on the finished device. Hence, accurate DCR statistics can be studied early in the process development, e.g., before completing the backside-illumination process. Third, this approach uses the ROIC and epoxy underfill as the mechanical support for the device (e.g., APD) layer and does not need a transparent quartz layer above the silicon for mechanical support. The elimination of the transparent quartz layer allows placement of low-f-number microlenses directly on the surface of the silicon. Finally, this chip-level process enables efficient use of ROICs and imaging array dies by ensuring that known-good imager arrays are hybridized to known-good ROICs.

Figure 2:
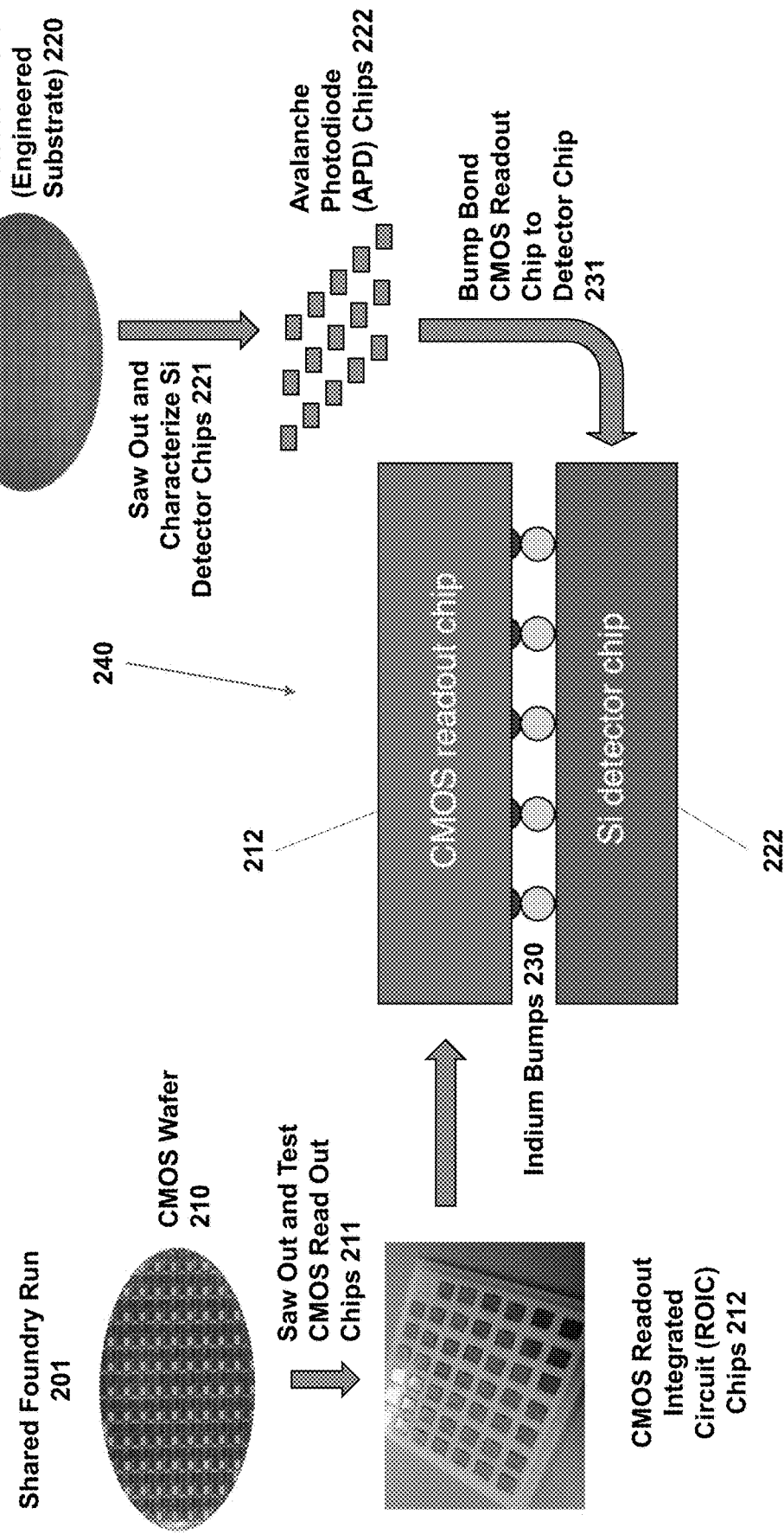
FIG. 2 illustrates a chip-level bump-bonding process for making an APD chip or other imaging array chip bonded to a CMOS ROIC chip.

FIG. 2 illustrates our process for rapidly prototyping single-photon-sensitive silicon APDs or other silicon imaging arrays. In this process, ROICs are fabricated in a CMOS wafer 210 in a (shared) foundry run 201. The CMOS wafer 210 is diced into individual ROIC chips 212, which can tested and characterized 211. In the meantime, a detector wafer 220, also called an engineered substrate, is created separately. This detector wafer 220 can be a silicon wafer for making silicon imaging arrays or a germanium wafer for making germanium imaging arrays. This detector wafer 220 is used as starting material for fabrication of the silicon imaging array. The finished arrays are characterized and then processed with indium bumps 230 in preparation for dicing and bump bonding to the ROIC chips 212. The detector wafer 220 is then diced into individual silicon imaging array chips 222, which are bump bonded to the ROIC chips 212 in step 231. Finally, the devices undergo chip-level thinning to remove the SOI handle wafer, using the SOI buried oxide layer as an etch stop to form completely integrated imaging array/ROIC devices 240. These steps are described in greater detail below.

Figure 1B:
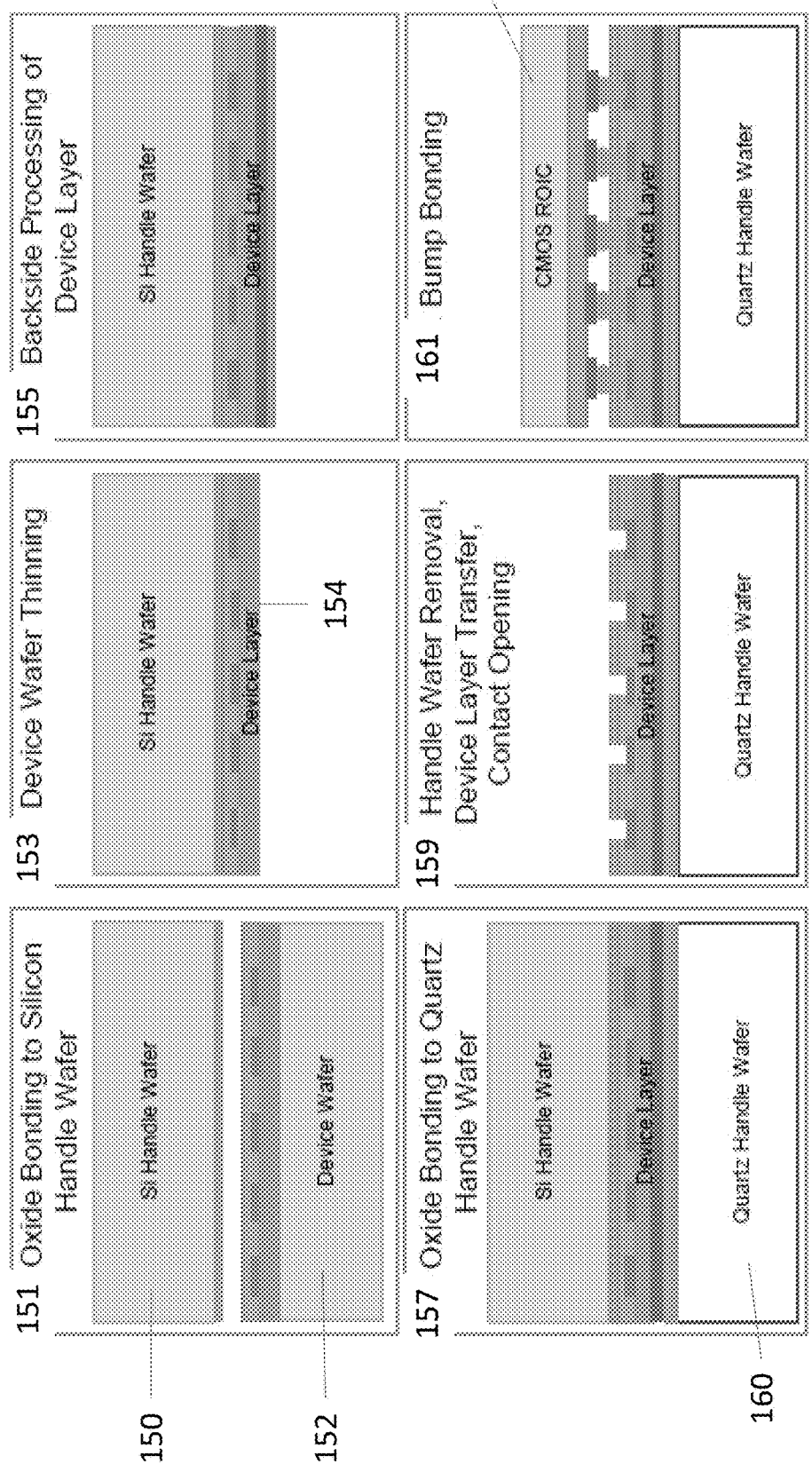
FIG. 1B illustrates a bump-bonding process for making APD arrays bonded to CMOS ROICs on side and quartz handles on the other side.

The process for rapidly prototyping imaging arrays in FIG. 2 has several advantages over the bump-bonding fabrication process shown in FIG. 1B. First, it is faster, in part because it does not involve both frontside and backside processing. Second, the imaging arrays are electrically complete before bump bonding, so they can be tested before they are mated to the ROICs. For example, each imaging array chip can be mated to a ROIC with the best-matched electrical characteristics. This increases the yield of the finished devices. Third, the imaging array is not mated to a quartz handle wafer, so it can be mated directly to a fast microlens array that increases the radiometric collection efficiency. Fourth, if its thickness is chosen properly, the thermal oxide layer can act as anti-reflection coating on the finished device.

Engineered Substrates

The imaging arrays layer is typically 10 μm thick. This is thick enough to absorb most of the incident light at visible and near infrared wavelengths, while thin enough not to introduce excessive timing jitter or require high operational voltages. This thickness is not sufficient to provide mechanical support for an entire wafer, so imaging arrays are typically fabricated on a SEMI standard thickness wafer, which is 725 µm thick. After processing the frontside-illuminated imaging arrays, the majority of this silicon (or germanium, for a germanium imaging array) is removed as it blocks the light from entering the active region of a backside-illuminated device. Removing all but 10 µm of silicon over the array involves precision removal with better than 1% non-uniformity. Such controlled removal of silicon can be done using an etch stop layer. Silicon dioxide is an excellent etch stop layer with various chemical etchants available for highly selective etching of silicon over oxide. The silicon dioxide layer can also act as an anti-reflection layer on the finished imaging arrays if its thickness is chosen based on the desired detection wavelength.

Commercial SOI wafers are available from many sources. However, these wafers typically do not have the backside passivation, the desired resistivity (160 Ω-cm), or the desired thickness. Hence, we fabricate our SOI wafers. These specially fabricated SOI wafers are sometimes called engineered substrates and can be made ahead of time and processed as desired to form APD chips.

FIG. 3A illustrates a process for making an engineered substrate. We grow a layer 312 of thermal oxide, such as silicon dioxide, on a handle wafer 310 (step 301) made of silicon. The thickness of this thermal oxide layer 312 may be selected so that the thermal oxide layer 312 acts as an anti-reflection coating on the finished imaging array. For visible wavelengths, this thickness is about 20 nm thick to about 200 nm thick.

In step 303, we grow a thin (e.g., 5 nm thick) thermal oxide layer on a device wafer 320. The device wafer has a resistivity of at least 20 Ω-cm (e.g., 160 Ω-cm). After thermal oxidation, the device wafer is implanted with a p+ doping, such as $1.5 \times 10^{14}$ cm$^{-2}$ BF$_2$ dopant 324 at 5 keV (step 303), if the body of the semiconductor is p-type. (Likewise, n doping will work if the body of the semiconductor is n-type.) This turns the thermal oxide layer into a backside passivation layer 322; for APDs, this backside passivation layer 322 reduces the surface contribution to DCR and collects the hole current generated by the avalanche process in the operating APDs. The implantation is done after oxidation to reduce diffusion of the boron-doped backside passivation.

After implantation, the two wafers are oxide bonded face-to-face (step 305) and annealed at 900° C. for 30 minutes in a nitrogen ambient atmosphere (step 307), which both activates the BF$_2$ implant and provides high bond strength. The bonded wafers form the engineered substrate 220, with the device wafer becoming a device layer and the handle wafer becoming a handle layer and the bonded passivation and thermal oxide layers sandwiched between the device and handle layers.

After the bonding anneal, the device layer 320 is thinned down to 10 µm thickness via chemical wet etching using HF/nitric/acetic acid mixture. The engineered substrate 220 may be rotated during this wet etch to achieve good etch uniformity. The device layer's thickness is monitored while thinning. After thinning, the device layer's thickness is measured using white-light interferometry. Thickness uniformity of ±0.2 µm is typically achieved for a 10 µm thick device layer and removal non-uniformity better than 0.3% is achieved over the planar wafer. Edges of the unbonded device layer 320 are removed with a dicing saw to prevent unbonded silicon from creating particles and defects during the subsequent processing of the APDs.

FIG. 3B shows a photograph of a finished engineered substrate. The engineered substrate is a specialized silicon-on-insulator (SOI) wafer which includes a 10 µm-thick 160 Ω-cm p-type silicon device layer with buried p+ implant for backside passivation on 100 nm thermal oxide bonding layer, which serves as the etch stop for the chip-level thinning process.

FIG. 3C is a photograph of a wafer with finished frontside-illuminated APDs on engineered substrates. The APDs are patterned photolithographically in a process that involves masking and illuminating the device layer. In the example shown in FIG. 3C, the APDs were fabricated on a 200-mm wafer with reticles that were about 20 mm×22 mm. After this frontside-illumination (photolithographic fabrication of the APDs), the APDs 326 are electrically complete, allowing for accurate characterization of the APDs' dark count rates (DCRs). The thermal oxide layer 312 isolates the APDs 326 from the handle layer 310, and the back passivation is already in place. This allows rapid design optimization for lowering the DCRs.

FIGS. 4A and 4B show cross sections of the engineered substrate 220 before and after fabrication of the APDs, respectively. Before fabrication of the APDs, the device layer 310 is about 10 µm thick and is on the p+ passivation layer 322, which is on a 100 nm thick thermal oxide (e.g., silicon dioxide) layer 312, which in turn is on the 725 µm thick handle layer 310. The APDs 326 are formed in the device layer 310, with electrical contacts 328 on the APDs 326. The thermal oxide layer 312 insulates the APDs 326 from the handle layer 310: current flows between contacts 328 via the APDs 326 and the passivation layer 322 as illustrated in FIG. 4B.

Hybridization and Chip-Level Processing

After the wafers are fabricated, under-bump metallization (UBM), which prevents a highly resistive junction from forming between aluminum metallization and indium, is patterned via lift-off. FIG. 5A shows 8-µm-high indium bumps patterned over the UBM. FIG. 5B shows a 3D scan of the indium bumps. The bump bonding can be done in a Smart Equipment Technology FC150 automated die/flip chip bonder. Here, the 32×32 100 µm-pitch array is bonded to an asynchronous ROIC that has been developed for optical communication. After bump bonding, the assembled chip is tested for functionality. For 32×32 100 µm-pitch arrays, 100% pixel connectivity is typically achieved.

FIG. 6A shows the fabrication process from hybridized chip to final thinning. At this point, the APD chip 222 is bonded to the ROIC chip 212 with bump bonds 230 underfilled with epoxy 602. Next, most of the handle layer 310, which is approximately 725 µm thick, is removed through mechanical sawing (step 601). The chip is mounted on a precision-thickness dicing tape, as shown in FIG. 7A. The optical focus provides the height of the ROIC 212 and the height of the detector array (APDs) 326. Using a precision stage, the dicing saw is brought 100 µm above the ROIC 212 to remove the bulk of the handle layer 310. Excellent device yield is achieved through this process. Because the APDs 326 are separated from the handle layer 310 by the thermal oxide layer 312, the mechanical thinning does not degrade the quality of the APD material.

The remaining silicon on the handle layer 310 is removed through chemical etching (step 603), with the thermal oxide layer 312 acting as an etch stop. The chemical etching is a dry, vacuum-based process that uses XeF$_2$ to selectively and isotropically remove silicon through a reaction that yields xenon and SiF$_4$. The XeF$_2$ sublimates from solid crystals to form the vapor phase etchant and provides excellent selectivity (e.g., about 1000:1) over oxide for silicon etching. If desired, the thermal oxide layer 312 can be etched after the silicon handle layer 310 has been removed, e.g., by etching with $HF_2$, and replaced with a multi-layer anti-reflective coating to increase the imager's sensitivity over a broader wavelength range.

FIG. 6B shows an APD/ROIC chip 640 with an integrated microlens array 642. The microlens array 642 is disposed directly on the APD array 326, which is about 10 microns thick, bonded to the ROIC 212 with bump bonds 230 and epoxy 602. As the microlens array 642 can be right next to the APD array 326, the focal lengths of the microlenses can be arbitrarily small (e.g., 100 μm) as long as the microlenses are align effectively with respect to the APDs.

Experimentally Demonstrated Performance of Fabricated APD Arrays

APD fabrication was performed on engineered substrates like those described above as well as on epitaxial silicon on p+ substrates, the latter of which serve as control wafers. The epitaxial layers of the control wafers have a resistivity of 160 Ω-cm, which is the same as the resistivity of the engineered substrates. The thickness of the epitaxial silicon was approximately 20 μm.

FIGS. 7-10 illustrate fabrication of the APDs on the engineered substrate and the DCRs of the APDs during the fabrication process. FIG. 7A shows two 32×32 hybridized APD/ROIC pairs are mounted on precision dicing tape in preparation for mechanical thinning down to 100 μm thick device layer. The pads on the ROICs were coated with protective polymer, then attached to the precision dicing tape. Once the APD/ROIC pairs were mounted securely, a dicing saw was used to remove the bulk of the substrate as explained above with respect to FIG. 6A. FIG. 7B shows a microscope image of a 32×32 APD ROIC after mechanical thinning. The vertical striations on the detector level are due to the dicing saw blade. The ROIC frame area is protected by polymer coating with blue dye added to aid visual inspection of the coating. FIGS. 8A and 8B show spatial dark count rate (DCR) maps of the 32×32 APD array of FIG. 7B before and after mechanical thinning, respectively. The DCR map is largely unchanged with a slight increase in the median dark count rate.

FIG. 9 is a die image of a finished 32×32 APD/ROIC after chemical thinning to 10 μm thick device layer. The surface of the APD device layer is black as 100 nm-thick oxide etch stop film also serves as an anti-reflection coating. FIGS. 10A and 10B show spatial maps of the DCRs for the 32×32 APD array of FIG. 9 before and after chemical thinning, respectively, at 36.6 V. The median DCR increased slightly after chemical thinning, from 13 kHz to 18 kHz. Without being bound by any particular theory, it is possible that the defect density within the silicon APD array increased during the chemical thinning process due to film stress exerted on the 10 μm-thick silicon layer by the epoxy and bumps.

FIG. 11 is a plot of reverse bias I-V characteristics of silicon APDs fabricated on two engineered substrates (ES1, ES2) and two 20-μm thick, epitaxial 160-Ω-cm silicon on 0.02-Ω-cm p-type substrates (Epi1, Epi2) for control. The breakdown voltages of the four devices were within 0.2 V of each other and around 30 V. The DCRs were also compared at 5 V over-bias using passive quenching setup using a resistor. The average dark count rate was 14 kHz on the engineered substrate compared to 0.5 kHz on the control wafer for a device with 30 μm cathode diameter and 25 μm multiplier diameter. The higher DCR in the engineered substrate may be due to thermally generated current near the buried silicon dioxide interface, which was expected to have a higher defect density than the epitaxial silicon/p+ silicon interface in the control wafer. In such a case, the higher DCR can be reduced by the improvement of passivation of the backside interface, e.g., by increasing peak doping levels in this back surface field.

The mask set included a couple variations of the 32×32 array of APDs. One of the design variations was the number of contacts to the cathode region. The contacts were made by etching vias in the silicon dioxide and forming a Ti/TiN liner and tungsten plug. The Ti/TiN liner directly in contact with the n+ cathode layer may have been a source of dark current. A benefit of the engineered substrates is that electrical connections to the APDs are complete at the end of the front-illumination process, and hence valid conclusions can be drawn at the time of completion of the front-illumination with regard to the dark count rates. Reducing the number of contacts per pixel from nine to two reduces the DCR by a factor of two or more as shown in TABLE 1. This result suggests that the number of contacts should be reduced on these APD designs. Also, higher doping levels in the cathode layer may suppress the electrons generated at the contact surface and lower their contribution to the total DCR.

TABLE 1

Dark count rate measurements at room temperature for the two design variations with different numbers of contacts to the pixel.

| 32 × 32 Design Version | Median DCR (kHz) @ 36.6 V |
| --- | --- |
| V1 (3 × 3 contacts per pixel) | 31 |
| V2 (2 × 1 contacts per pixel) | 13 |

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of fabricating an imaging device, the method comprising:
    depositing a thermal oxide layer on a handle wafer;
    forming a backside passivation layer on a device wafer;
    bonding the backside passivation layer on the device wafer to the thermal oxide layer on the handle wafer to form an engineered substrate having the thermal oxide layer and the backside passivation layer between a handle layer and a device layer;
    forming an imaging array in the device layer of the engineered substrate;
    dicing the engineered substrate into an imaging array chip comprising the imaging array;
    bonding a read-out integrated circuit to the imaging array chip; and
    removing at least a portion of the handle layer from the imaging array chip.

2. The method of claim 1, wherein the handle wafer is a silicon handle wafer, the thermal oxide layer comprises silicon dioxide, and the device wafer is a silicon device wafer.

3. The method of claim 1, wherein the device layer has a resistivity of at least 20 Ω-cm.

4. The method of claim 1, wherein depositing the thermal oxide layer on the handle wafer comprises growing the thermal oxide layer to a thickness of about 20 nm to about 200 nm.

5. The method of claim 1, wherein the thermal oxide layer is a first thermal oxide layer and forming the backside passivation layer on the device wafer comprises:
    depositing a second thermal oxide layer on the device wafer; and
    implanting a $p^+$ dopant into the second thermal oxide layer to form the passivation layer.

6. The method of claim 1, wherein forming the imaging array in the device layer comprises forming at least one of an avalanche photodiode, a charge-coupled device, or an active pixel sensor.

7. The method of claim 1, further comprising, after bonding the backside passivation layer to the thermal oxide layer and before forming the imaging array, thermally annealing the backside passivation layer and the thermal oxide layer.

8. The method of claim 1, further comprising, after bonding the backside passivation layer to the thermal oxide layer and before dicing the engineered substrate into the imaging array chip, thinning the device layer to a thickness of about 10 μm.

9. The method of claim 1, further comprising, before bonding the read-out integrated circuit to the imaging array chip, testing the read-out integrated circuit and/or the imaging array chip.

10. The method of claim 1, wherein bonding the read-out integrated circuit to the imaging array chip comprises forming at least one bump bond between the read-out integrated circuit and the imaging array chip.

11. The method of claim 10, further comprising:
disposing epoxy between the imaging array chip and the read-out integrated circuit.

12. The method of claim 1, wherein removing at least a portion of the handle layer comprises chemically etching the handle layer to the thermal oxide layer.

13. The method of claim 12, wherein removing at least a portion of the handle layer further comprises mechanically thinning the handle layer before chemically etching the handle layer to the thermal oxide layer.

14. The method of claim 1, further comprising:
disposing a microlens array directly on a surface of the imaging array chip opposite from the read-out integrated circuit.

15. An imaging device made according to the method of claim 1.

16. A method of fabricating an imaging device, the method comprising:
depositing a first silicon dioxide layer having a thickness of about 60 nm to about 100 nm on a silicon handle wafer having a resistivity of about 160 Ω-cm;
depositing a second silicon dioxide layer having a thickness of about 5 nm on a silicon device wafer having a resistivity of about 160 Ω-cm;
implanting $BF_2$ into the second silicon dioxide layer to transform the second silicon dioxide layer into a passivation layer;
thermally bonding the first silicon dioxide layer to the passivation layer to form an engineered substrate having the first silicon oxide layer and the passivation layer between a silicon handle layer formed of the silicon handle wafer and a silicon device layer formed of the silicon device wafer;
thinning the silicon device layer to a thickness of about 10 μm;
forming an avalanche photodiode (APD) array in the silicon device layer;
dicing the engineered substrate into an APD chip comprising the APD array;
bump-bonding a read-out integrated circuit to the APD chip; and
removing the silicon handle layer from the APD chip.

17. The method of claim 16, further comprising:
testing the APD chip before bump-bonding the read-out integrated circuit to the APD chip.

18. The method of claim 16, further comprising:
bonding a microlens array to the APD chip after removing the silicon handle layer from the APD chip.

* * * * *